US009735008B2

(12) United States Patent
Merrell et al.

(10) Patent No.: US 9,735,008 B2
(45) Date of Patent: Aug. 15, 2017

(54) USE OF SURFACTANTS TO CONTROL ISLAND SIZE AND DENSITY

(71) Applicant: University of Utah Research Foundation, Salt Lake City, UT (US)

(72) Inventors: Jason Merrell, Draper, UT (US); Feng Liu, Salt Lake City, UT (US); Gerald B. Stringfellow, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 134 days.

(21) Appl. No.: 14/063,143

(22) Filed: Oct. 25, 2013

(65) Prior Publication Data

US 2014/0130731 A1  May 15, 2014

Related U.S. Application Data

(60) Provisional application No. 61/718,189, filed on Oct. 25, 2012.

(51) Int. Cl.
*H01L 21/02* (2006.01)
*C30B 25/02* (2006.01)
*C30B 29/40* (2006.01)

(52) U.S. Cl.
CPC .......... *H01L 21/0262* (2013.01); *C30B 25/02* (2013.01); *H01L 21/0254* (2013.01); *H01L 21/0257* (2013.01); *H01L 21/0259* (2013.01); *H01L 21/02389* (2013.01); *H01L 21/02398* (2013.01); *H01L 21/02458* (2013.01); *C30B 29/403* (2013.01)

(58) Field of Classification Search
CPC ........... H01L 21/02458; H01L 21/0254; H01L 21/02389; H01L 21/0259; C30B 25/02; C30B 29/403
USPC ................................................ 117/84, 88, 952
See application file for complete search history.

(56) References Cited

FOREIGN PATENT DOCUMENTS

JP          11354843 A  * 12/1999  ............. H01L 33/00

OTHER PUBLICATIONS

European Patent Office, English Computer translation of JP 11354843 A (2015).*
Zhang et al., "The addition of sb as a surfactant to GaN growth by metal organic vapor phase epitaxy," Journal of Applied Physics, vol. 92, No. 5, p. 2304-2309 (2002).*
Sadasivam et al, "Antimony Surfactant Effect on Green Emission InGaN/GaN multi quantum wells growby by MOCVD", Journal of nanoscience and nanotechnology, vol. 11, p. 1787-1790, (2011).*

* cited by examiner

*Primary Examiner* — Matthew Song
(74) *Attorney, Agent, or Firm* — Thorpe North & Western, LLP

(57) ABSTRACT

Methods of controlling island size and density on an OMVPE growth film may comprise adding a surfactant at a critical concentration level, allowing a growth phase for a first period of time, and ending the growth phase when desired island size and density are achieved. For example, the island size and density of an OMVPE grown InGaN thin film may be controlled by adding an antimony surfactant at a critical concentration level.

17 Claims, 3 Drawing Sheets

USE OF SURFACTANTS TO CONTROL ISLAND SIZE AND DENSITY

CROSS-REFERENCE TO RELATED APPLICATION

This application claims the benefit of U.S. Provisional Application No. 61/718,189, filed Oct. 25, 2012, the disclosure of which is incorporated herein by reference in its entirety.

REFERENCE TO GOVERNMENT RIGHTS

This invention was made with government support under DE-FG02-04ER46148 awarded by the Department of Energy. The government has certain rights in the invention.

TECHNICAL FIELD OF THE INVENTION

The present invention relates to a method of improving performance of blue and green light emitting diodes (LEDs) by the use of surfactants during orgometallic vapor phase epitaxy (OMVPE).

BACKGROUND OF THE INVENTION

Indium gallium nitride (InGaN) has become a topic of intense research due to its invaluable optoelectronic properties. This ternary III/V semiconductor is a seemingly ideal material for LEDs due to its direct bandgap that is tunable across the visible range by varying the relative amounts of gallium nitride (GaN) and indium nitride (InN). InGaN is currently used in commercially produced blue and green LEDs, but the material makes poor yellow and red LEDs due to inherent materials quality issues.

Epitaxial growth of nitride semiconductors has been challenging and difficult to understand. This can be attributed to many materials problems: lack of a native substrate, lattice mismatch to common substrates, solid phase immiscibility between GaN and InN, comparatively high vapor pressure of InN, and difference in formation enthalpies of GaN and InN. These problems contribute to material defects, inhomogeneous alloying, and phase separation that affect the film quality and emission characteristics.

Surfactants have emerged in recent decades as a powerful tool for controlling epitaxial growth and achieving more desirable film qualities. Surfactants are active surface species that modify surface free energy, have negligible solubility in the bulk, and low desorption coefficients. During the growth process, surfactants accumulate on the surface, changing the thermodynamics and kinetics of growth. The effects of surfactants have been reported for many different material systems and diverse results have been seen.

One of the first reported results of surfactant-mediated epitaxial growth was the change in surface morphology of films. It was observed that by reducing the free energy of the growth surface with a surfactant, 3D islanding of the film was kinetically inhibited. Much of the literature attributed this to surfactant-modified atomic surface processes such as surface diffusion and adatom step-edge attachment. Zhang et al. observed an interesting change during the lateral epitaxial overgrowth (LEO) of GaN by OMVPE. A change in the dominant growth facets occurred with the addition of Sb. At 1025° C., undoped GaN had predominant, sloped growth planes of $\{1\bar{1}01\}$. When Sb was added to the growth process, the predominant growth facets shifted to vertical $\{11\bar{2}0\}$. A similar shift in growth facets occurred at a growth temperature of 1075° C. with sloped sloped $\{11\bar{2}2\}$ facets shifting again to vertical $\{11\bar{2}0\}$ facets with the addition of Sb to the growth process.

Alloy composition has also been changed by the addition of surfactant. It has been shown that N incorporation in GaAs:N is reduced by Sb, Bi, and Tl surfactants. This was attributed to accumulation of surfactants on the growth surface blocking N adsorption and incorporation. Furthermore, Sb surfactant was reported to change impurity concentrations in GaAs. Zn and In dopant concentrations increased significantly with the addition TESb to the OMVPE growth process, which was explained theoretically by an intriguing dual surfactant effect involving the presence of H on the surface. A more recent study showed an increase in the In composition of InGaN with the addition of Sb to hydride vapor phase epitaxial (HYPE) growth. This was accompanied by a change in the aligning direction of InGaN nanostructures on the surface.

Another effect that has been reported in the literature is a surfactant-induced change in microstructure. One example of this was the change in CuPt—B ordering in GaInP with the addition of Sb. Small amounts of Sb were shown to decrease the amount of CuPt—B ordering making a more homogeneous alloy. However, above a certain threshold concentration, Sb induced a new triple period ordered structure. This was attributed to surfactant-induced changes in surface reconstruction. Other studies showed that increasing Sb concentrations led to an increase in the presence of lateral compositional modulation in GaInP that reduced the low temperature photoluminescence (PL) peak energy.

SUMMARY OF THE INVENTION

The effects of the surfactant antimony (Sb) on indium gallium nitride (InGaN) grown by organometallic vapor phase epitaxy (OMVPE) were studied. Eight samples of InGaN were grown with Sb concentrations ranging from 0% to 2.5%. Characterization was done by photoluminescence (PL) and atomic force microscopy (AFM). An abrupt change in PL emission peak energy and surface morphology occurred at a certain critical Sb concentration. Above and below this threshold concentration two distinct regimes of surface morphology and PL emission characteristics were observed. This effect was interpreted as due to a surfactant-induced change of surface phase on the InGaN films.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific example embodiments thereof which are illustrated in the appended drawings. Understanding that these drawings depict only typical implementations of the invention and are not therefore to be considered to be limiting of its scope, the invention will be described and explained with additional specificity and detail through the use of the accompanying drawings.

DETAILED DESCRIPTION OF THE INVENTION

We have invented a method for controlling the microstructure of thin layers of InGaN of the type used in quantum-well blue and green LEDs. The addition of the surfactant Sb has been demonstrated to affect a significant increase in the density, and a concomitant decrease in the size, of the Stranski-Krastinov islands spontaneously formed during OMVPE growth. This change in microstructure is also evinced in a change in In incorporation, resulting in a change in bandgap energy. These effects will have major influences on the color of the LED as well as the LED performance.

Although a broad range of experimental results have been reported, the effects of surfactants on nitride semiconductors have not yet been widely explored. This disclosure reports the use of an Sb surfactant on the OMVPE growth of InGaN. We have discovered that the Sb surfactant causes a marked shift in bandgap, In incorporation, and surface morphology of the film at a certain critical Sb concentration.

InGaN was grown on 2 inch (0001) sapphire wafers by OMVPE at 720° C. The In/(In+Ga) ratio was 0.64, and the growth rate was 0.39 Å/s. A GaN buffer layer was deposited on the sapphire prior to epitaxial growth of InGaN. In order to test the effects of Sb on the growth process and resulting film characteristics, different samples were grown with varying ratios of TMSb to Ga and In in the vapor. The first test batch consisted of samples grown with 0%, 0.5%, 1%, and 2% TMSb. Growth time was 38 seconds to give an approximate average film thickness of 1.5 nm. Months later, a second batch was grown with Sb concentrations of 0.75%, 1.25%, 1.75%, and 2.5%. These samples were grown with two different film thicknesses, 1.5 nm (38 second growth time) and 3 nm (75 second growth time). All other growth parameters were unchanged.

Figure 1:
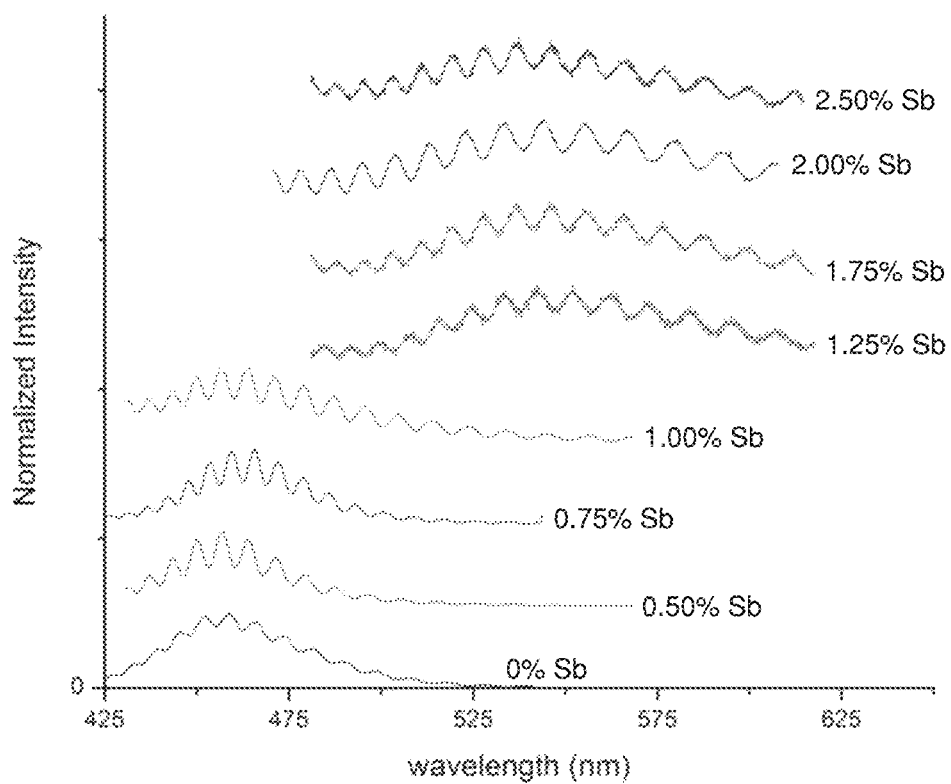
FIG. 1 illustrates normalized PL spectra of the InGaN samples from 425 to 625 nm.

Characterization of the samples was then conducted to determine surface morphology, In incorporation, and photo emission spectra. Photoluminescence was performed with a 349 nm high intensity laser. AFM was done with a Brunker Dimension Icon apparatus operating in the quantum nanomechanical mapping mode. Photoluminescence spectra from the samples showed a large characteristic GaN peak from the underlying buffer layer, and a less intense peak from the InGaN film. The GaN peak occurred at the same emission energy for each sample but an interesting shift occurred in the InGaN peaks. Samples grown with 0%-1% Sb all showed the same blue emission peak at 2.7 eV, while samples grown with 1.25%-2.5% Sb all showed the same green emission peak at approximately 2.3 eV. This can be seen in FIG. 1 where the normalized PL emission spectrum for each sample from 425-625 nm is shown. The marked shift in the emission peak from blue to green is seen to occur at a critical concentration of Sb surfactant between 1% and 1.25%. The spectra also showed large interference pattern oscillations which were an important indication of where the emission originated. These emissions were from the top layer InGaN thin film, and were not due to the yellow emission of GaN. FIG. 1 Normalized PL spectra of the InGaN samples from 425 to 625 nm.

The bandgap of each sample was taken from its respective PL peak. The bandgap of $In_xGa_{1-x}N$ depends on the value of x and ranges from that of InN (0.7 eV) to that of GaN (3.4 eV). Equation 1 gives the bandgap energy as a function of alloy composition and In incorporation was calculated from this relationship.

$$E_g = 3.42 \text{ eV} - x2.72 \text{ eV} - x(1-x)1.43 \text{ eV} \quad \text{Equation 1}$$

Figure 2:
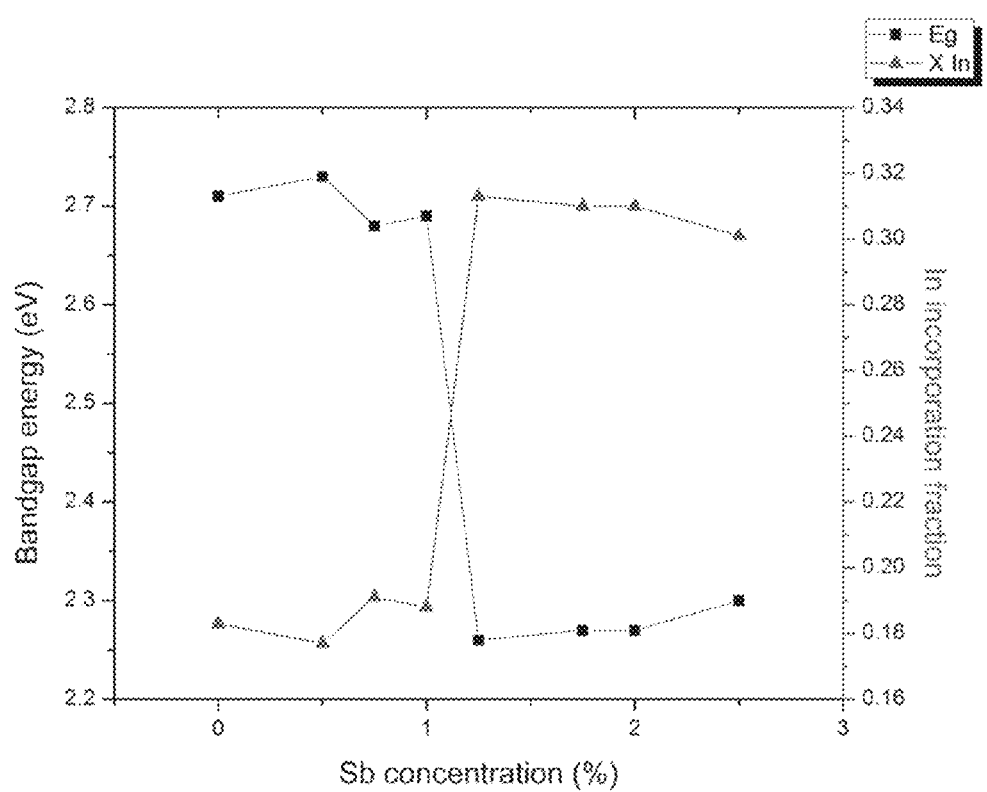
FIG. 2 illustrates bandgap energy and In incorporation vs Sb concentration, calculated using Equation one with the measured PL peak energies.

FIG. 2 shows the bandgap and In incorporation in the film as a function of Sb concentration. An abrupt change in the bandgap energy and alloy composition was induced by Sb concentrations above 1%. The bandgap was shifted from 2.3 eV to 2.7 eV with an accompanied shift in In concentration from 18% to 31%.

FIG. 2 Bandgap energy and In incorporation vs Sb concentration, calculated using Equation one with the measured PL peak energies. A marked shift in material properties such as the one observed here is often indicative of a phase change. The structure of the growth surface has profound effects on the microstructure of the material. Different surface reconstructions provide the thermodynamic driving force for different microstructures and hence, different film properties. Wixom et al. presented a calculated surface phase diagram for GaInP as a function of Sb, showing the dependence of the surface reconstruction on Sb concentration. They showed that different surface phases led to different ordered structures in the film. Given that the surface reconstruction is dependent on the Sb concentration, the abrupt changes seen in FIG. 2 could be due to a surface phase change at the critical Sb concentration. A new surface phase would then provide the driving force for a solid composition with higher In content. This marked shift in film properties is indicative of a surface phase change or a change in surface reconstruction induced by Sb.

Figure 3:
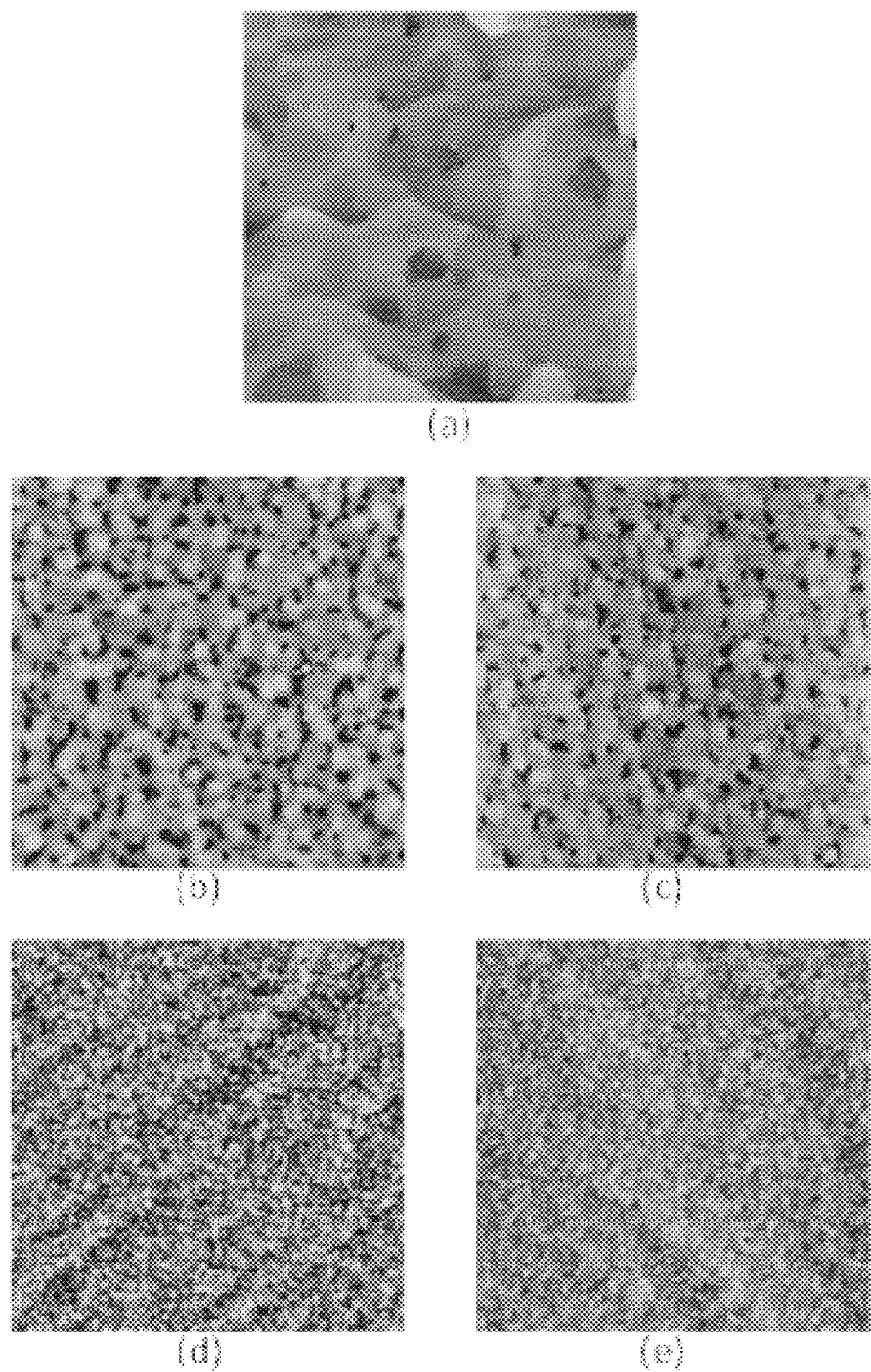
FIG. 3 illustrates 1×1 micron AFM images of (a) 0%, (b) 0.5%, (c) 1%, (d) 1.25, (e) 2%. Images (b) and (c) show the same relative island size and density of samples grown with Sb concentrations under the critical value, while (d) and (e) are abvove the critical Sb concentration.

The abrupt change in bandgap and solid composition was also reflected in the surface morphology of the films seen by AFM, and coincided with the idea of a surface phase change due to surfactant coverage. The 1×1 μm AFM images in FIG. 3 show various InGaN sample surfaces grown under different Sb concentrations. FIG. 3(a) shows the surface of InGaN produced with no surfactant present during growth. FIGS. 3(b) and 3(c) show surfactant-mediated growth below the critical Sb concentration while 3(d) and 3(e) were grown with Sb above the critical concentration. These images show a different surface morphology above and below the critical Sb concentration.

Island density increased and island size decreased with the addition of Sb to the growth process. In the literature, this effect is often attributed to a surfactant-induced change in surface diffusion length or step edge incorporation of adatoms. However, one would intuitively expect such surfactant-induced changes in atomic surface processes to produce a gradual change in film characteristics as Sb concentration increases. If, for example, the presence of surfactant atoms on the growth surface increased the surface diffusion length of adatoms, a gradual increase in surface diffusion length would be expected with increasing surfactant coverage. This, in turn, would give a gradual change in film morphology. In contrast, the morphology change in these samples occurs abruptly at a certain Sb concentration.

Samples grown with Sb concentrations from 0.5% to 1%, showed a distinct morphology that did not change substantially with increasing Sb. Island size and density remained relatively constant in this regime. Samples grown with Sb concentrations from 1.25% to 2.5% showed another distinct morphology with no substantial change in island size or density with increasing Sb. This abrupt change in surface morphology and PL emission spectra at a particular Sb surface coverage is difficult to explain only in terms of surfactant modified atomic surface processes such as diffusion and step-edge attachment, but more likely indicates a surfactant-induced change in surface reconstruction. FIG. 3 1×1 micron AFM images of (a) 0%, (b) 0.5%, (c) 1%, (d) 1.25%, (e) 2%. Images (b) and (c) show the same relative island size and density of samples grown with Sb concentrations under the critical value, while (d) and (e) are above the critical Sb concentration.

In summary, we have shown the effects of Sb surfactant on OMVPE grown InGaN thin films. Samples were grown with Sb concentrations ranging from 0% to 2.5% while all other growth conditions were unchanged. Samples were characterized by PL and AFM. These methods revealed an abrupt change in bandgap, solid composition, and surface morphology of the films at a certain critical surfactant concentration. Above and below this threshold concentration around 1% Sb, two distinct regimes of surface morphology and PL emission characteristics were observed. This effect was interpreted as due to a surfactant-induced change of surface phase on the InGaN films.

Therefore, it was discovered that the addition of small quantities of the surfactant Sb during the OMVPE growth of thin layers of InGaN, of the type used in high efficiency green and blue LED devices has a significant effect on important properties of the epitaxial layers. First, above a certain critical Sb concentration the addition of Sb causes a marked increase in the density of Stranski-Krastinov (S-K) islands and a concomitant decrease in their size. For example, FIG. 3(a) shows the smooth InGaN surface without Sb. FIG. 3(b) shows the S-K island morphology induced by Sb below the critical value. FIG. 3(e) shows the marked increase in S-K island density that occurs above the critical Sb concentration.

Second, above this critical Sb concentration, the concentration of In incorporated in the islands increases significantly, causing a marked reduction in the bandgap energy. This was confirmed by high excitation intensity photoluminescence (PL) measurements. Samples grown with sub-critical Sb concentrations, including no Sb surfactant, showed a ~460 nm emission peaks. Above the critical Sb concentration, the emission peak shifted to ~545 nm (see FIG. 1), characteristic of higher In incorporation. Both the bandgap energy and In incorporation were calculated from the PL emission peaks. The results are illustrated in FIG. 2.

These results indicate that an Sb surfactant can be used to manipulate the morphology of InGaN to produce desired properties. The performance, i.e., the efficiency and brightness, of blue and green LEDs made by OMVPE in the GaN/InGaN/AlInGaN system has been well documented to be highly dependent on the microstructure of the InGaN in the active, thin quantum-well layers. Even though the effect is understood, there have been few tools for controlling the microstructure. Based on evidence gained in the InGaP system, it was hypothesized that surfactants, such as Sb, added during the OMVPE growth process, would have a significant effect on the InGaN microstructure for thin layers. Two sets of experimental data showed that this is indeed the case. Thus, it is believed that the use of surfactants during OMVPE growth will be a valuable tool for improving the performance of blue and green LEDs. These principles can also be used in solar cells and transistors.

The present invention may be embodied in other specific forms without departing from its spirit or essential characteristics. The described implementations are to be considered in all respects only as illustrative and not restrictive. The scope of the invention is, therefore, indicated by the appended claims rather than by the foregoing description. All changes which come within the meaning and range of equivalency of the claims are to be embraced within their scope.

The following references are hereby incorporated by reference in their entirety:

1. Stringfellow, G. B., Microstructures produced during the epitaxial growth of InGaN alloys. Journal of Crystal Growth, 2010. 312(6): p. 735-749.
2. Yam, F. K. and Z. Hassan, InGaN: An overview of the growth kinetics, physical properties and emission mechanisms. Superlattices and Microstructures, 2008. 43(1): p. 1-23.
3. Copel, M., et al., Surfactants in epitaxial growth. Physical Review Letters, 1989. 63(6): p. 632-635.
4. Massies, J. and N. Grandjean, Surfactant effect on the surface diffusion length in epitaxial growth. Physical Review B, 1993. 48(11): p. 8502-8505.
5. Zhang, L., H. F. Tang, and T. F. Kuech, Effect of Sb as a surfactant during the lateral epitaxial overgrowth of GaN by metalorganic vapor phase epitaxy. Applied Physics Letters, 2001. 79(19): p. 3059-3061.
6. Dimroth, F., et al., Influence of Sb, Bi, Tl, and B on the incorporation of N in GaAs. Journal of Applied Physics, 2002. 91(6): p. 3687-3692.
7. Shurtleff, J. K., S. W. Jun, and G. B. Stringfellow, Surfactant effects on doping of GaAs grown by organometallic vapor phase epitaxy. Applied Physics Letters, 2001. 78(20): p. 3038-3040.
8. Zhu, J., F. Liu, and G. B. Stringfellow, Enhanced cation-substituted p-type doping in GaP from dual surfactant effects. Journal of Crystal Growth, 2010. 312(2): p. 174-179.
9. Ok Jin Eun, J. D. W., Jeon Hun Soo, Lee Ah Reum, Lee Gang Suok, Kim Kyung Hwa, Ahn Hyung Soo, Yang Min, Structural Change of InGaN Nanostructures Grown by Mixed-Source Hydride Vapor Phase Epitaxy. Japanese Journal of Applied Physics, 2011. 50(1).
10. Fetzer, C. M., et al., The use of a surfactant (Sb) to induce triple period ordering in GaInP. Applied Physics Letters, 2000. 76(11): p. 1440-1442.
11. Fetzer, C. M., et al., Sb enhancement of lateral superlattice formation in GaInP. Applied Physics Letters, 2001. 78(10): p. 1376-1378.
12. Fetzer, C. M., et al., Spectroscopic study of surfactant enhanced organometallic vapor phase epitaxy growth of GaInP. Journal of Applied Physics, 2001. 90(2): p. 1040-1046.
13. Wu, J., et al., Narrow bandgap group III-nitride alloys. physica status solidi (b), 2003. 240(2): p. 412-416.
14. Wixom, R. R., G. B. Stringfellow, and N. A. Modine, Theory of Sb-induced triple-period ordering in GaInP. Physical Review B, 2001. 64(20): p. 201322.

What is claimed is:
1. A method of incorporating indium onto a growth film at an elevated growth temperature comprising:
providing a growth film;
depositing a buffer layer on the growth film;

placing the growth film in an organometallic vapor phase epitaxy (OMVPE) growth environment having an elevated growth temperature;

flowing a vapor comprising gallium and indium into the growth environment;

adding antimony (Sb) at least at or above a critical concentration level into the vapor; and allowing the vapor to flow to maintain a growth phase for a period of time;

wherein after said growth phase and said period of time an indium incorporation fraction is at least 0.20 on a resultant growth film; and wherein adding the antimony at least at or above the critical concentration level results in an abrupt change in bandgap energy.

2. The method of claim 1, wherein the growth film comprises a sapphire wafer.

3. The method of claim 1, wherein the buffer layer comprises gallium nitride (GaN).

4. The method of claim 1, wherein the elevated growth temperature is at least 720° C.

5. The method of claim 1, wherein the In/(In+Ga) ratio is about 0.64.

6. The method of claim 1, wherein a growth rate of the growth phase is 0.39 Å/s.

7. The method of claim 1, wherein the critical concentration level of the Sb in the vapor ranges from greater than 1% to less than 1.25%.

8. The method of claim 7, wherein the resultant growth film exhibits a bandgap energy of about 2.7 eV.

9. The method of claim 7, wherein the resultant growth film exhibits an indium concentration of at least about 31%.

10. The method of claim 1, wherein an indium incorporation fraction on the growth film is at least 0.25.

11. The method of claim 1, wherein an indium incorporation fraction on the growth film is at least 0.29.

12. The method of claim 1, wherein a surface of the resultant growth film comprises Stranski-Krastinov islands having an island size and density and wherein the island size and density exhibit an abrupt morphology change over a surface of a second resultant growth film comprising Stranski-Krastinov islands having a second island size and density which are grown under substantially the same conditions except at an Sb concentration below the critical concentration level.

13. The method of claim 1, wherein the resultant growth film exhibits a PL emission spectra that differs from the PL emission spectra of a second resultant growth film grown under substantially the same conditions except an Sb concentration below the critical concentration level.

14. The method of claim 1, wherein the critical concentration level of the Sb in the vapor is greater than 1%.

15. A method of making an indium gallium nitride film comprising:

providing a sapphire wafer;

depositing a gallium nitride (GaN) layer on the sapphire waffer;

placing the sapphire wafer in an organometallic vapor phase epitaxy (OMVPE) growth environment having temperature of at least 720° C.;

flowing a vapor comprising gallium and indium into the growth environment;

adding antimony (Sb) at least at or above a critical concentration level into the vapor; and allowing the vapor to flow for a growth phase for a period of time;

wherein after said growth phase and said period of time an indium incorporation fraction is at least 0.20 on a resultant indium gallium nitride film; and wherein adding the antimony at least at or above the critical concentration level results in an abrupt change in bandgap energy.

16. The method of claim 15, wherein the critical concentration level of the Sb ranges from greater than 1% to less than 1.25%.

17. The method of claim 15, wherein the critical concentration level of the Sb is greater than 1%.

* * * * *